United States Patent
Graumann et al.

(10) Patent No.: US 9,564,922 B1
(45) Date of Patent: Feb. 7, 2017

(54) ERROR CORRECTION CODE DECODER WITH STOCHASTIC FLOOR MITIGATION

(71) Applicant: PMC-SIERRA US, INC., Sunnyvale, CA (US)

(72) Inventors: Peter Graumann, Calgary (CA); Sean Gibb, Calgary (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 203 days.

(21) Appl. No.: 14/642,072

(22) Filed: Mar. 9, 2015

Related U.S. Application Data (60) Provisional application No. 61/955,397, filed on Mar. 19, 2014.

(51) Int. Cl.
H03M 13/03 (2006.01)
H03M 13/11 (2006.01)

(52) U.S. Cl.
CPC ....... H03M 13/1142 (2013.01); H03M 13/114 (2013.01)

(58) Field of Classification Search
CPC .. H03M 13/09; H03M 13/114; H03M 13/116; H03M 13/1102; H03M 13/1105; H03M 13/111; H03M 13/2948
See application file for complete search history.

(56) References Cited

U.S. PATENT DOCUMENTS

| | | | |
|---|---|---|---|
| 8,020,070 B2 * | 9/2011 | Langner | H03M 13/11 714/752 |
| 8,196,016 B1 * | 6/2012 | Langner | H03M 13/11 714/758 |
| 8,448,039 B2 | 5/2013 | Gunnam | |
| 8,806,307 B2 | 8/2014 | Alrod et al. | |
| 8,898,537 B2 | 11/2014 | Gross et al. | |
| 2011/0311002 A1 * | 12/2011 | Li | H03M 13/1102 375/341 |
| 2014/0019825 A1 * | 1/2014 | Aliseychik | G06F 11/10 714/763 |
| 2015/0026536 A1 * | 1/2015 | Hubris | G06F 11/1048 714/758 |

FOREIGN PATENT DOCUMENTS

WO 2009/156883 A1 12/2009

* cited by examiner

*Primary Examiner* — David Ton
(74) *Attorney, Agent, or Firm* — Dennis R. Haszko (57) ABSTRACT

A method and apparatus as described herein provide a novel modification to any iterative FEC decoder method that can improve FER performance in the error floor region. Many iterative FEC methods, such as commonly used LDPC decoders, have error floors where the performance of the decoder does not improve below a certain threshold. Error Floors are caused by trapping sets from which traditional methods cannot escape. With Stochastic Floor Mitigation, according to embodiments of the present disclosure, noise is strategically added to the operations occurring during decoding resulting in significantly improved error floor performance.

21 Claims, 10 Drawing Sheets

FIG. 1

PRIOR ART

PRIOR ART

ERROR CORRECTION CODE DECODER WITH STOCHASTIC FLOOR MITIGATION

CROSS-REFERENCE TO RELATED APPLICATIONS

This application claims the benefit of priority of U.S. Provisional Patent Application No. 61/955,397 filed Mar. 19, 2014, which is incorporated herein by reference in its entirety.

FIELD

The present disclosure relates generally to forward error correction (FEC) decoders. More particularly, the present disclosure relates to error floors in FEC decoders including, but not limited to, layered low density parity check (LDPC) decoders.

BACKGROUND

Low Density Parity Code (LDPC) decoders are current generation iterative soft-input forward error correction (FEC) decoders that have found increasing popularity in FEC applications where low error floor and high performance are desired. LDPC decoders are defined in terms of a two-dimensional matrix, referred to as an H matrix, which describes the connections between the data and the parity. The H matrix comprises rows and columns of data and parity information. Decoding an LDPC code requires solving the LDPC code according to the H matrix based on a two-step iterative method. Soft-decoding the code causes convergence of the solved code with the true code; convergence is achieved over a number of iterations and results in a corrected code with no errors.

A category of LDPC codes, known as quasi-cyclic (QC) codes, generates an H matrix with features that improve the ease of implementing the LDPC encoder and decoder. In particular, it is possible to generate a QC-LDPC H matrix where some rows are orthogonal to each other. These orthogonal rows are treated as a layer, and rows within a layer can be processed in parallel, thus reducing the iterative cost of the decoder. It is advantageous to reduce the number of iterations necessary to decode an LDPC code.

Figure 1:
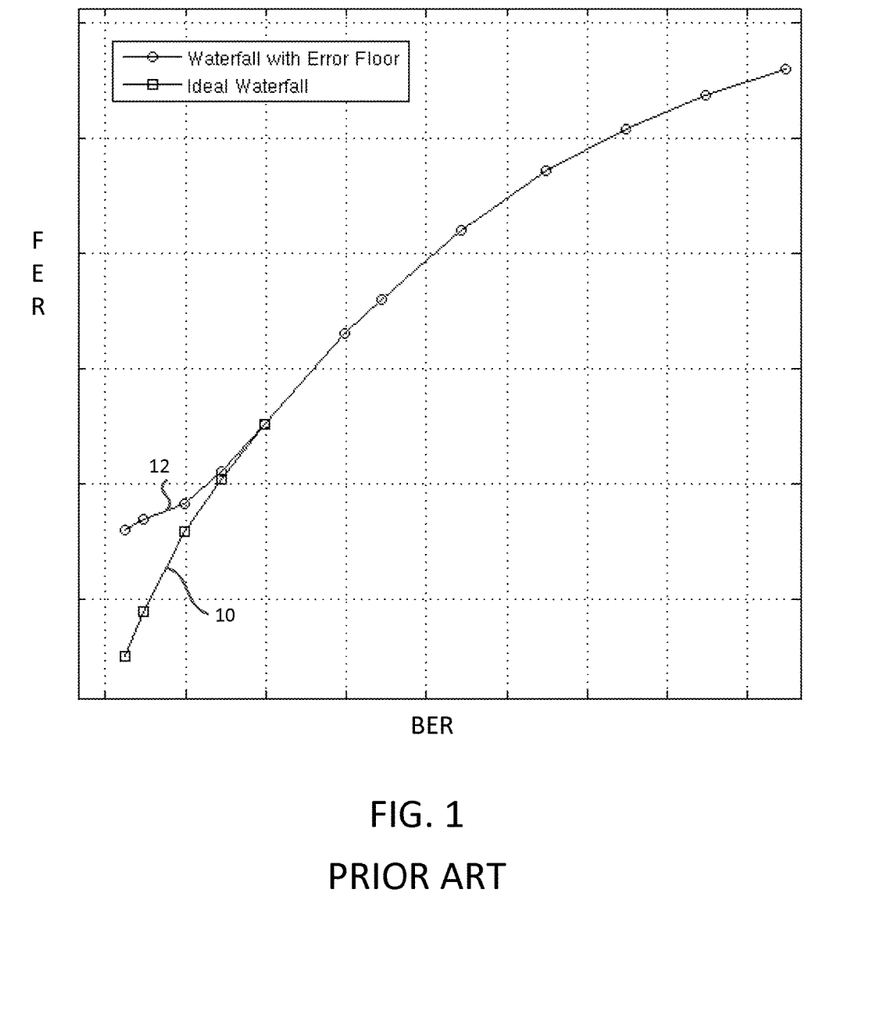
FIG. 1 is a graph illustrating ideal versus error floor decoder waterfall plot.

LDPC codes typically have an error floor in terms of frame error rate (FER) performance as shown in FIG. 1. In the example shown in FIG. 1, the FER performance of the decoder follows ideal waterfall performance 10 until the error floor region of the code is approached. At this point, the real decoder performance 12 begins to diverge from ideal 10, eventually reaching a condition where the FER performance only improves slowly as the input BER is reduced.

Such error floors are caused by trapping sets where the decoder can no longer determine the correct solution method that will lead to eliminating the remaining errors even when given an infinite number of decode iterations. Such trapping sets are typically near code words containing a small number of errors compared to the real solution. A trapping set can be defined by a fixed number of failing check nodes, optionally plus or minus 1 in an oscillating pattern.

Error floors are present in most every LDPC code (or other code), even those employed in many communications standards. For many systems this error floor issue is accepted so long as the error floor of the H matrix used is below the requirement for the communication standard. For example, for a mobile wireless communication system, there are fading conditions that can periodically render a given link un-usable; such a communication system must be able to deal with high frame error rates and still be effective. In such a standard an error floor of 1e-5 would be acceptable, any losses at this point would not be noticed due to the inherent noise floor in the medium.

In the present disclosure, the error floor itself is defined as the FER at which the FER waterfall plot of the code diverges nearly horizontally from the ideal waterfall plot. Many communications standards have much lower error floor requirements, some at FER=1e-8 or FER=1e-10 and even lower. The difficulty of finding an H matrix exhibiting a given error floor increases exponentially with each decadal drop in the required error floor.

In some cases the exact trapping set or sets of a given H matrix can be dealt with using custom-built changes to the convergence methods of the decoder in question. Such custom methodic enhancements are expensive to generate, difficult to determine and ultimately only deal with a few of the trapping sets in any given H matrix.

Improvements in forward error correction approaches error floor mitigation are desirable.

DETAILED DESCRIPTION

A method and apparatus as described herein provide a novel modification to an iterative FEC decoder method that can improve FER performance in the error floor region. Many iterative FEC methods, such as commonly used LDPC decoders, have error floors where the performance of the decoder does not improve below a certain threshold. Error floors are caused by trapping sets from which traditional methods cannot escape. With Stochastic Floor Mitigation, according to embodiments of the present disclosure, noise is strategically added to the operations occurring during decoding, resulting in significantly improved error floor performance.

According to an embodiment, the present disclosure provides an Error Correction Code (ECC) decoder, comprising: one or more layer processors, each of the one or more layer processors including: a check node processor; a delay element for storing extrinsic information; a stochastic floor mitigation (SFM) circuit configured to correct trapping set conditions, the stochastic floor mitigation circuit comprising a noise generator circuit provided between a check node processor output and an output of the ECC decoder.

In another embodiment, the SFM circuit further comprises a trapping set detector to determine when a trapping set has been encountered.

In another embodiment, the SFM circuit is enabled based on a determination of the trapping set detector.

In another embodiment, the SFM circuit is enabled in response to completion of a threshold number of iterations independent of a determination of the trapping set detector.

In another embodiment, the noise generation circuit comprises an additive noise source that adds noise to an output of the check node processor.

In another embodiment, the noise generation circuit comprises an attenuation factor modulator for modifying an attenuation factor associated with the check node processor.

In another embodiment, the attenuation factor modulator comprises an attenuation factor multiplier for modifying an attenuation factor associated with each check node output of the check node processor.

In another embodiment, the SFM circuit comprises a biased noise source configured to generate a noise magnitude between a maximum and minimum value for a number of configurable iterations or layers.

In another embodiment, the ECC code is a Low Density Parity Check (LDPC) code.

In another embodiment, the trapping set detector comprises a single trapping set detector in communication with each of the one or more layer processors to determine when a trapping set has been encountered.

In another embodiment, the trapping set detector is configured to detect a trapping set condition based on a count of all check nodes that are passing within the decoder.

In another embodiment, the trapping set detector is configured to receive a parity status from one or more check nodes and to output an enable to the noise generation circuit of each of the one or more layer processors.

In another embodiment, the trapping set detector is configured to detect a trapping set condition based on a count, for each of the at least one layer processors, of bit flips observed between an output of the noise generation circuit and an input of the check node processor.

In another embodiment, the trapping set detector is configured to detect a trapping set condition based on a magnitude observed at an input of the one or more layer processors.

In another embodiment, the ECC decoder further comprises a Layered LDPC Decoder configured to perform a LDPC decoding operation.

In another embodiment, the layered LDPC Decoder comprises: a codeword memory element to store a full FEC block to be processed; a plurality of shift processors configured to perform a circulant shift operation specified by an H matrix; a plurality of layer processors; a noise source affecting the output of the check node processor; a SFM controller configured to enable and control an SFM method performed by the SFM circuit.

In another embodiment of the ECC decoder, a single Layer Processor accepts one input, VC, from every column in the H matrix every clock cycle.

In another embodiment, some of the inputs in the Layer Processor are to a maximum zero value for an all-zero entry in the H matrix.

In another embodiment of the ECC decoder, a Layer Processor comprises: a subtractor for removing the previous extrinsic information for this layer from VC to form the Check Node input; a Check Node for calculating an approximation of the belief propagation method; an adder for combining the Check Node input and Check Node output; and a delay element for storing the Check Node output for use in a subsequent iteration.

In another embodiment, the noise source is configured to apply additive noise to the check node outputs.

In another embodiment, the noise source is implemented as a modulation factor applied to the attenuation factor of the check node.

Figure 2:
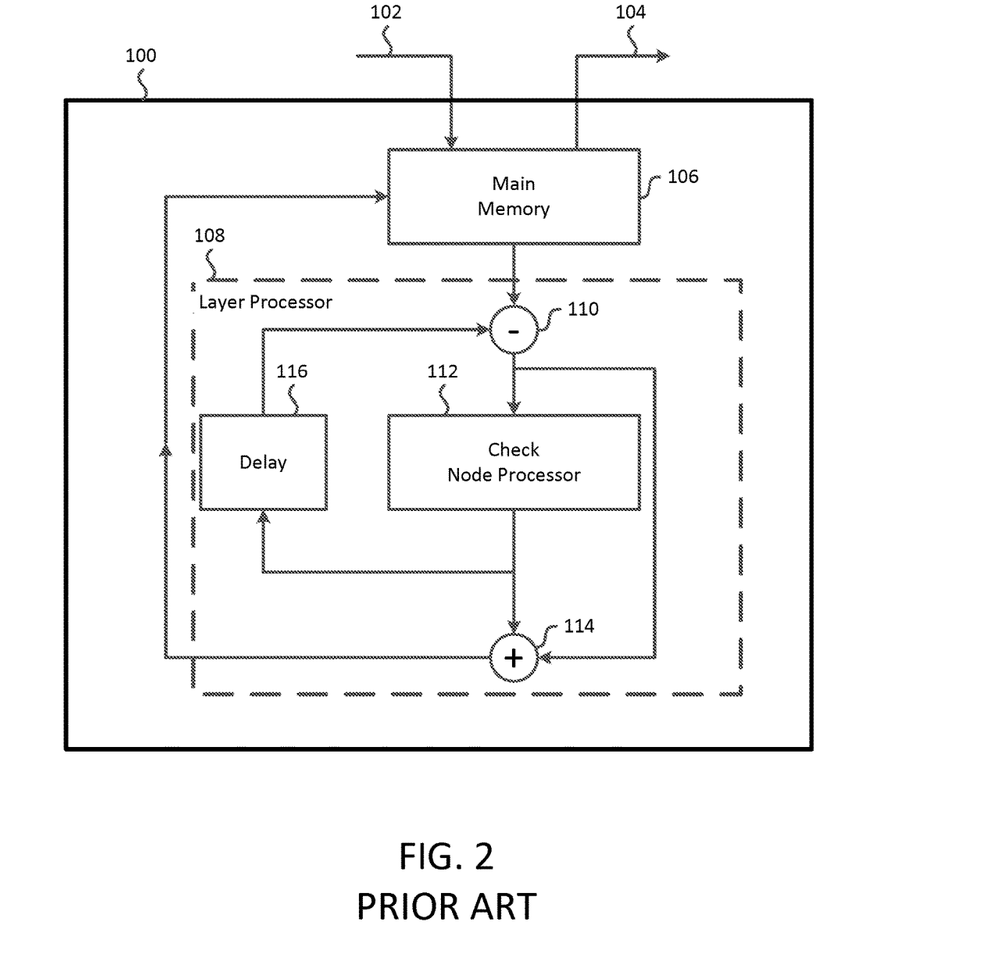
FIG. 2 is a block diagram illustrating a known high speed LDPC architecture.

Prior to discussing embodiments of the present disclosure in detail, FEC decoders will be discussed in general. Referring to FIG. 2, a block diagram illustrating a known architecture of an iterative FEC decoder is shown. In the embodiment shown in FIG. 2, the FEC decoder is a layered LDPC decoder 100. The decoder 102 has an input 102 and an output 104. Noisy data arrives from the channel, as soft information, to the decoder at the input 102 and is typically routed to a main memory 106 in a manner that avoids pipeline stalls. The main memory 106 includes a plurality of memory storage elements (not shown). In an embodiment, each memory storage element is a two-port memory supporting one write and one read per clock cycle. In an embodiment, the two-port memory of each memory element is implemented as two-port register files.

An output of the main memory 106 is connected to an input of each layer processor 108. Each layer processor 108 includes a subtractor 110, a check node processor 112, an adder 114, and a delay element 116. The delay element 116 also includes memory storage elements. Each of the layer processors 108 operate in parallel with one another.

The subtractor 110 in the layer processor 108 removes the extrinsic information for the layer in the H matrix currently being operated on. The check node processor 112 performs an approximation of the belief propagation method, such as the min-sum method described above, or its alternatives, and outputs extrinsic information. The adder 114 combines the extrinsic information generated by the check node processor 112 with the channel information for the layer and provides it to the main memory 106 for storage for the next update. The delay element 116 feeds back the extrinsic information for the processing in the next iteration. The iterative decode process proceeds based on the specified H matrix until the decode process has completed either by converging to a solution or running out of processing time.

Embodiments of the present disclosure provide a simple generic method that can be used on any H matrix and on any trapping set exhibited in such matrix that can break trapping sets.

One way to deal with error floor conditions in an FEC system is to find a better code construction that naturally exhibits a lower error floor during operation. For LDPC codes, the code description is represented as an H matrix containing R rows and D+R columns of values, with each value being a Quasi-Cyclic shift value in the range of Q. The total number of possible codes in this case then is $Q^{(R*(R+D))}$.

Even for modest values of Q, R and D, the number of possible codes becomes NP-complete, often on the order of 1e100 or more. Methods can be developed to find good codes by construction and to search efficiently codes that exhibit good performance, but the large search space is nevertheless daunting.

Embodiments of the present disclosure describe an enhancement to iterative decoding FEC methods that can significantly improve error floor performance of an FEC decoder. In particular, a method is presented as implemented within an LDPC decoder, which is the most commonly used FEC method used in modern communications systems. Embodiments of the present disclosure are also implemented in other FEC methods, such as flood scheduled LDPC decoders and Turbo decoders.

As background, the major operational elements of a layered LDPC decoder are described. A Stochastic Floor Mitigation (SFM) method according to embodiments of the present disclosure is described; several embodiments within the context of a layered LDPC decoder are presented. In the most general terms, SFM begins adding some noise to the normal processing calculations occurring within the decoder to give some hill-climbing capabilities to the decoder and thereby overcome trapping sets.

Figure 3:
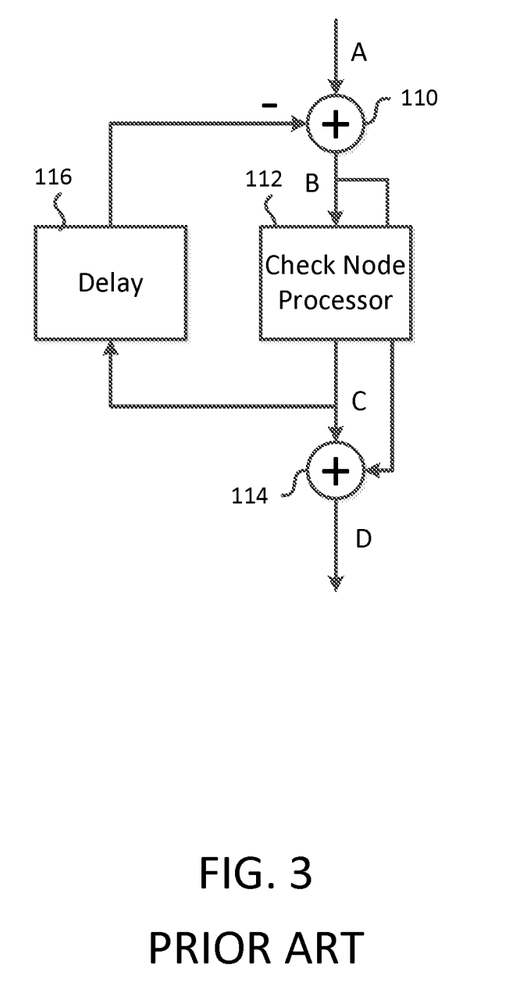
FIG. 3 is a block diagram illustrating operation of a known layer processor.

The layered decoding processes one layer at a time, updating both the check node and variable node values in a single cycle. FIG. 3 includes the typical flow for the Layer Processor, with further detail compared to FIG. 2.

In the FIG. 3, point A is the summation of the channel and all extrinsic values for a given column C in the QC-H matrix, that is $A=V_C(t)$. The subtractor 110 between point A and point B removes the extrinsic information for the row currently being operated on. Point B is the channel plus the extrinsic information for all rows except the row currently being operated on and can be defined by the formula $B(t)=V_C(t)-C_{C,r}(t)$ where $C_{C,r}(t)$ is the check node output of the previous cycle. Effectively this calculation ensures that the input to a check node does not contain any information from itself from a previous layer. The check node processor 112 output, point C, is calculated based on the following equation:

$$C_{C,r}(t+1)=f(\min_{j=1,N_C} B_{C,j}(t)) \quad \text{Equation 1}$$

where $f$ is an approximation of belief propagation function and where $0<j\leq N_C$ and $j\neq r$.

Common approximation functions include minsum adjust and attenuated minimum, or other similar approaches known to a person of ordinary skill in the art. A typical attenuation factor setting for example is 0.75. The attenuation factor is set in relation to the check node processor 112, and is typically applied to the minimum value found. Each output then would be the minimum magnitude of the other inputs multiplied by this 0.75 value. The value of about 0.75 is an approximation value; in some cases attenuation values of between about 0.5 and about 0.85 can be used. The output of the layer processor, point D, is the channel plus the extrinsic information for all rows except the row currently being operated on, plus the updated extrinsic information for the row being processed, and is defined by the formula $D(t+1)=V_C(t)-C_{C,r}(t)+C_{C,r}(t+1)$. The delay element 116 stores the updated extrinsic information for this column and row and saves it for the next time this column is processed to form the data at point B.

Trapping Sets

Figure 4:
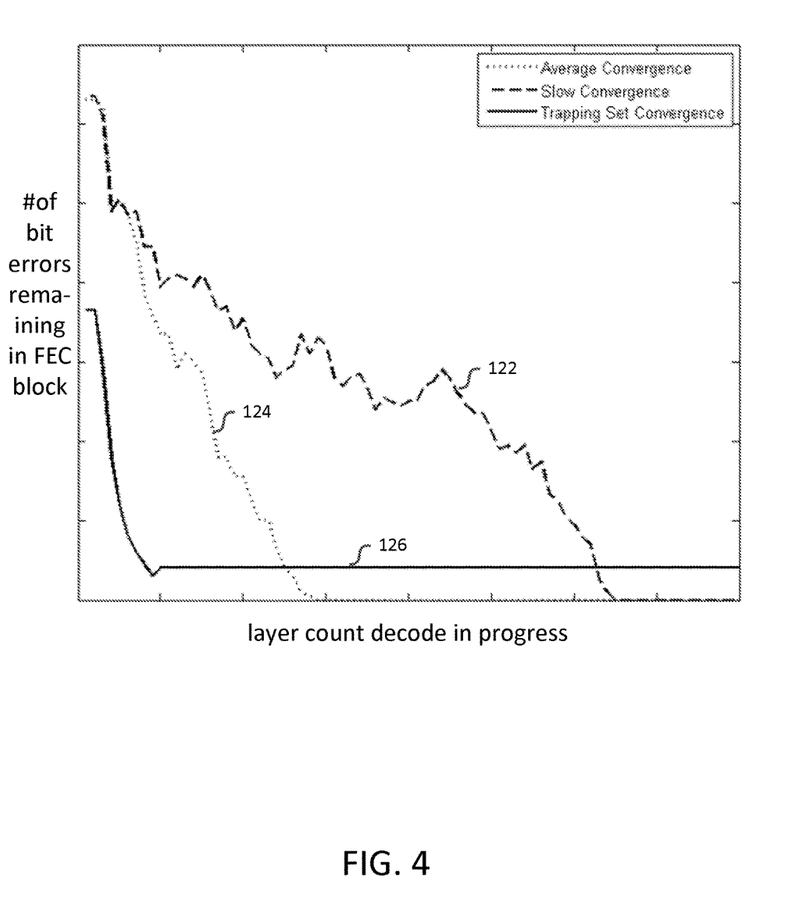
FIG. 4 is a graph illustrating bit error convergence trajectories.

FIG. 4 is a graph illustrating bit error convergence trajectories. A standard convergence method can result in a variety of outcomes during decoding. In some cases a FEC block can converge quickly to a correct solution, or it can take a longer period of time to arrive at convergence; another possibility is a trapping set. Three different convergence profiles are shown in FIG. 4, where the vertical axis is the number of bit errors remaining in FEC block and the x axis is the layer count decode in progress. For both the long or slow convergence case 122 and average convergence case 124, the final output from the decode operation is a correct FEC block; however, in the trapping set case 126, the decoder oscillates between different configurations, each containing a low number of errors. Once the trap is entered, further iterations will make no progress.

Stochastic Floor Mitigation

Figure 5:
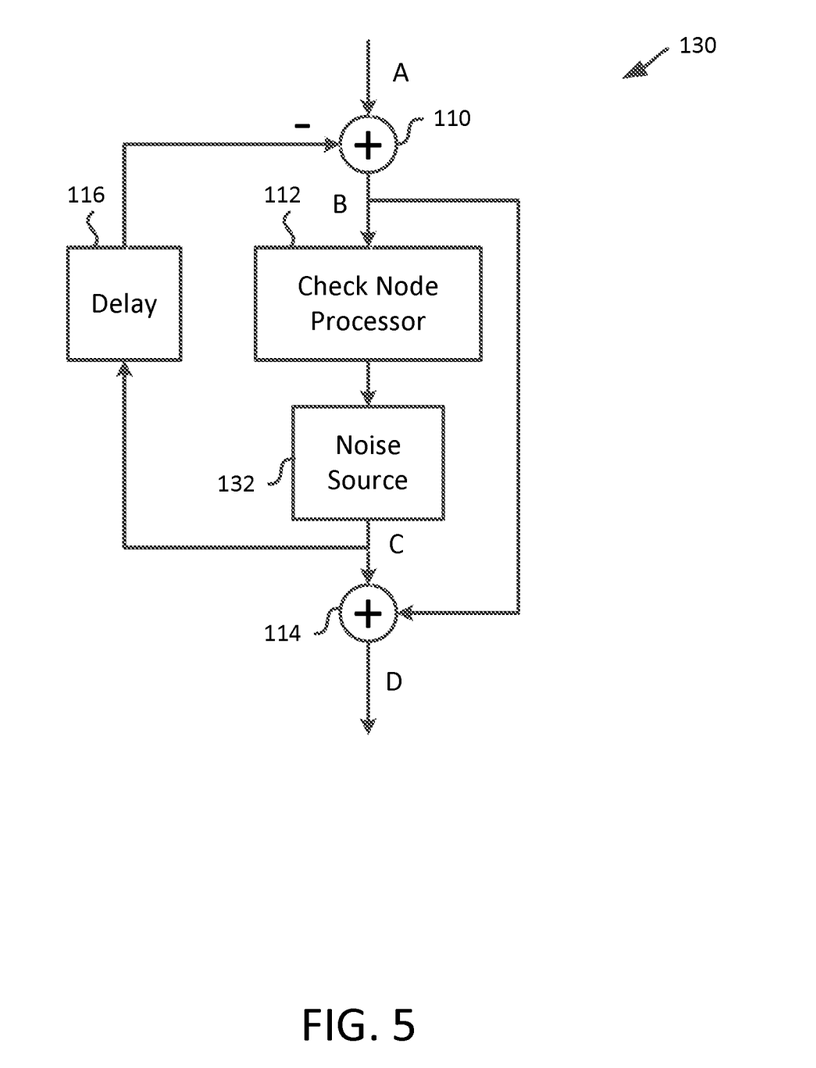
FIG. 5 is a block diagram illustrating a layered LDPC decoder with stochastic floor mitigation according to an embodiment of the present disclosure.
Figure 6:
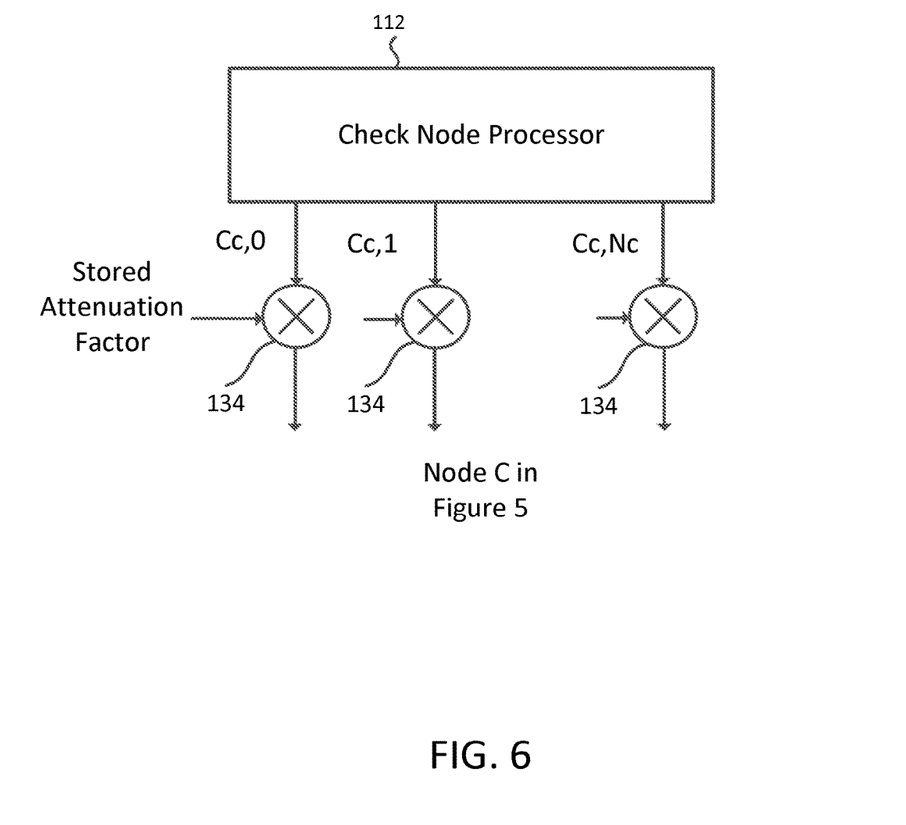
FIG. 6 illustrates a partial implementation of a layered LDPC decoder with stochastic floor mitigation according to an embodiment of the present disclosure implementing an attenuation modulation approach.

FIG. 5 is a block diagram illustrating a layered LDPC decoder 130 with stochastic floor mitigation according to an embodiment of the present disclosure. To enable SFM within the context of a layered LDPC decoder, embodiments of the present disclosure provide a noise source, or noise generation circuit, 132 just below the output of the check node processor 112 as shown in FIG. 5. In an implementation, the noise source 132 is provided in communication with the check node processor 112 and the adder 114, or between the check node processor 112 and the point C. The noise source 132 can be added in a number of different ways. An example method, described in more detail later in relation to FIG. 6, is to modulate an attenuation factor that is used in current implementations of a layered LDPC decoder. Such modulation would vary the attenuation factor between 0.5 and 0.9 where the typical value here is simply held at a constant typically 0.75, as described earlier.

Figure 7:
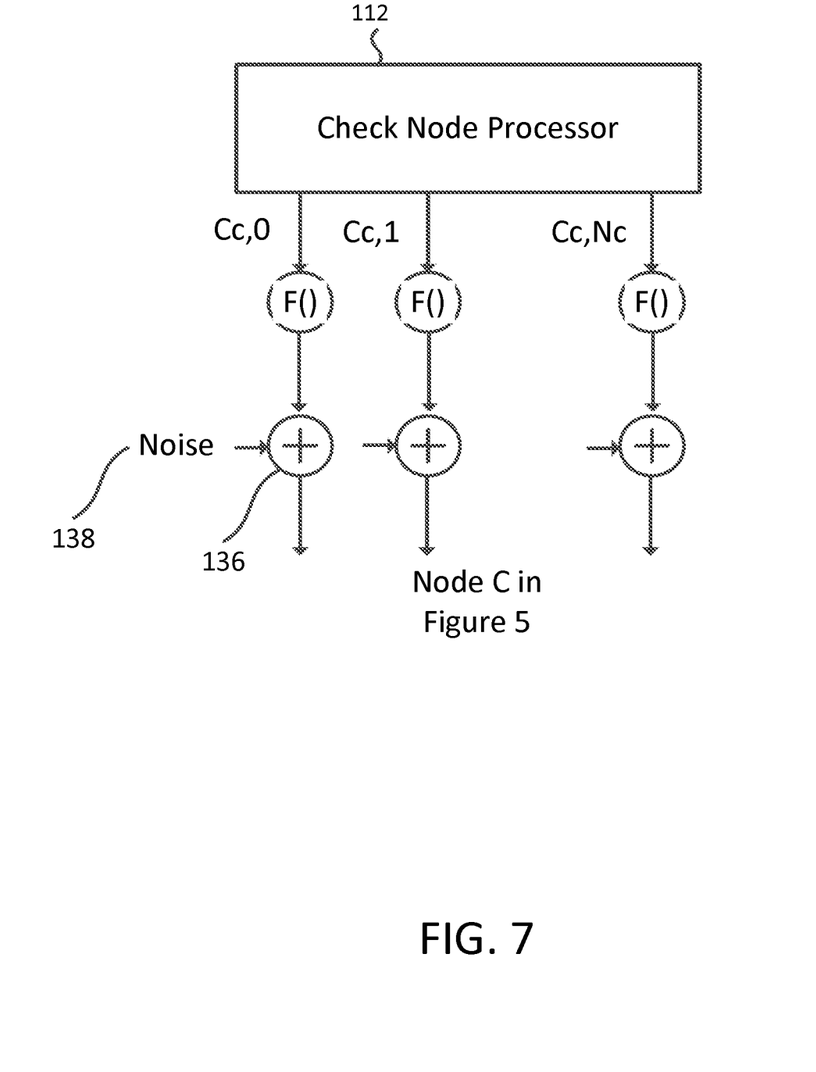
FIG. 7 illustrates a partial implementation of a layered LDPC decoder with stochastic floor mitigation according to an embodiment of the present disclosure implementing a noise source addition approach.

Another method that lends itself well to any decoding strategy, described in more detail later in relation to FIG. 7, is to use an additive noise source after the check node output. This additive noise will be a signed value, which may be non-symmetric about zero, which is a relatively small value compared to the standard check node output. Attenuation factor modulation is a less invasive method of implementing SFM while adding noise to the check node output gives better error floor mitigation but can negatively impact the critical path of the design.

FIG. 6 illustrates a partial implementation of a layered LDPC decoder with stochastic floor mitigation according to an embodiment of the present disclosure implementing an attenuation modulation approach. The standard check node outputs as described in Equation 1 above are shown followed by attenuation factor multipliers 134. The attenuation factor itself is generally stored as a registered element that is held constant at ~0.75 to implement standard belief propagation.

FIG. 6 shows the stored attenuation factor being provided as an input to the attenuation factor multipliers 134. During SFM this stored attenuation factor can be modulated over different cycles to be a random value between upper and lower bound values. In an example embodiment, an upper bound of 0.9 and a lower bound of 0.5 are used during SFM. The attenuation factor itself being a registered value and connecting to circuitry which is in place during normal decoding operations allows SFM to be implemented without critical path implications for the overall decoder.

In relation to the embodiment of FIG. 6, the output of the check node processor 112 is either min or min2. Accordingly, in an example embodiment, the attenuation modulation is applied to all outputs, all of the outputs having a magnitude value of either min or min2. For example, the first attenuation factor multiplier 134 can be applied at Cc,0 when that value is min or min2.

In an example implementation, a check node has 64 inputs with signed-magnitude values, and finds the minimum magnitude (min) and the $2^{nd}$ minimum (min2). The output magnitude for 63 of the outputs is the min value and the output value for the remaining output is the min2 value. The min2 output is used in the output value corresponding to the input where the minimum was found. Following this procedure, the output at the check node point is the minimum of the other 63 inputs. Usually, the output is multiplied by 0.75 but with SFM activated the decoder uses a modulated Attenuation Factor instead of the stored attenuation factor value.

FIG. 7 illustrates a partial implementation of a layered LDPC decoder with stochastic floor mitigation according to an embodiment of the present disclosure implementing a noise source addition approach. In the noise source addition method shown in FIG. 7, an adder 136 is provided below the belief propagation approximation method and Node C from FIG. 5. During normal operation a noise input of the SFM adder is tied to zero, while during SFM operation a random noise source 138 is applied to this input.

In an example embodiment, the noise source 138 of FIG. 7 is a PRBS (pseudo random bit sequence) generated random noise sequence plus or minus a few LSBs of the LLR. In an example implementation, the noise source comprises a Linear Feedback Shift Register (LFSR). In another embodiment, the noise source comprises a random number generator.

In an example implementation of FIG. 7, the noise source 138 comprises a biased noise source. A biased noise source alternates between set values, such as between +2 and −3, setting upper and lower limits, so on average the output is reduced. In an embodiment, the maximum and minimum value of the noise is set. In an example embodiment, the biased noise source alternates between plus and minus up to 3 LSBs, with either or both of the upper or lower limits being tunable. In another example embodiment, the biased noise source alternates between plus or minus 2 LSBs.

In example embodiments in relation to FIGS. 5 to 7, the noise source can be turned on or activated after a predetermined number of iterations. For example, for a total number of 20 iterations, the noise source can be activated after 10 iterations. In another example embodiment, the noise source can be enabled during all iterations.

In a further example embodiment, the noise source is activated in response to an indication of occurrence of a trapping set. For example, in response to an indication of being in a trapping set, the noise source is enabled to enable a hill-climbing optimizer. Such an enabling of the noise source in response to an indication or detection of a trapping set has been shown to drop the error floor by about a decade.

Trapping Set Detection

In an embodiment of the present disclosure, an additional step of trap set detection is added before enabling stochastics, to avoid impacting the normal convergence operations of a decoder that does a good job of recovering information in all non-trap cases.

Figure 8:
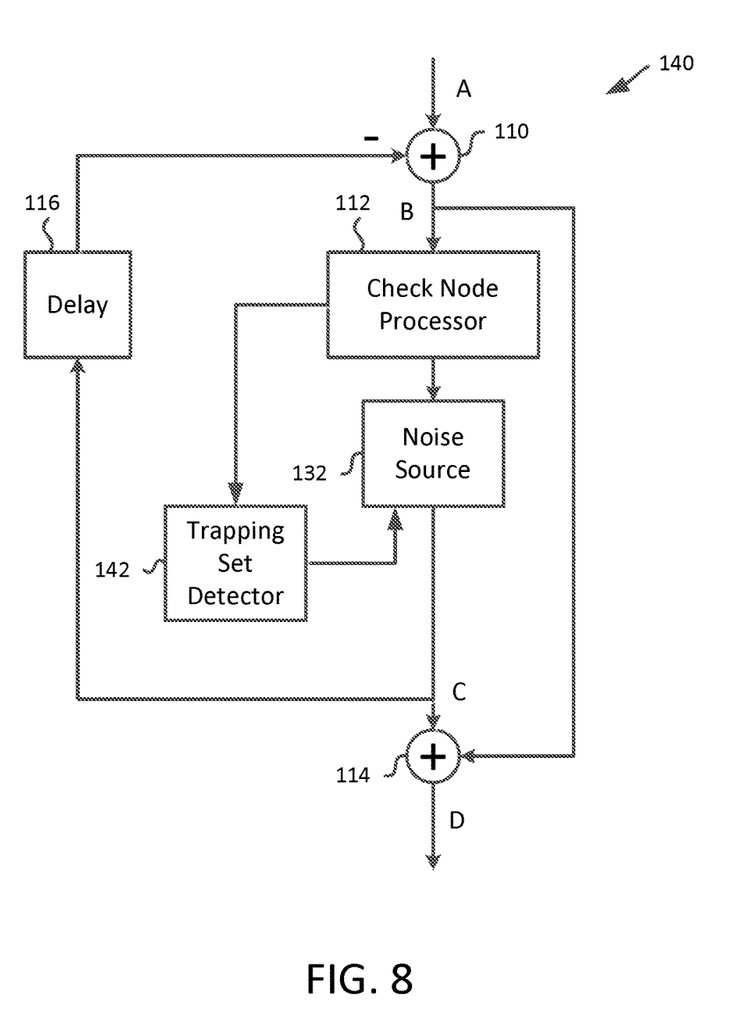
FIG. 8 is a block diagram illustrating a layered LDPC decoder with stochastic floor mitigation and trapping set detection according to an embodiment of the present disclosure.

FIG. 8 is a block diagram illustrating a layered LDPC decoder 140 with stochastic floor mitigation and trapping set detection according to an embodiment of the present disclosure. The decoder 140 of the example embodiment of FIG. 8 includes a trapping set detector 142, which is in communication with the noise source 132 and with the check node processor 112. Within any iterative FEC method, there are methods for determining that we have entered a trapping condition. In the case of LDPC codes, trapping set detection can be performed by keeping track of the number of check nodes that are passing, or alternatively the number of check nodes that are failing, during the operation of the given FEC block. In an example embodiment, the trapping set detector 142 is configured to receive a count of a number of passing check nodes, or a number of failing check nodes, during the operation of a given FEC block, such as during decoding.

In an example embodiment, the trapping set detector 142 is configured to count all of the check nodes that are passing at any time within the decoder 140. As each check node is processed, the number of even (passing) check nodes is accumulated. Once a full iteration is completed (all check nodes in the code), a final "convergence count" can be calculated or produced.

In an embodiment, the decoder 140 comprises one central trapping set detector 142 configured to detect a trapping set condition in all layers, not one detector per layer. All check nodes pass parity status to the trapping set detector 142, which in turn passes an enable to all check node noise generators, or noise sources 132.

In a first alternative embodiment, the trapping set detector 142 is configured to determine that a trapping condition exists by counting bit flips between C and B over all check nodes and outputs. In response to detection of a trap condition, the decoder 140 stops flipping bits.

In a second alternative embodiment, the trapping set detector 142 is configured to determine that a trapping condition exists by tracking the magnitude (for example, using a MSB) at the A inputs of all check nodes. In a trap condition, many of the values are very high (indicating convergence) but if processing continues even with high LLR magnitudes then we are in a trap.

In a third alternative embodiment, SFM is enabled after a threshold number of iterations have been processed. For example, the noise source is turned on after running more than 10 iterations, independent of a determination made by the trapping set detector 142.

Figure 9:
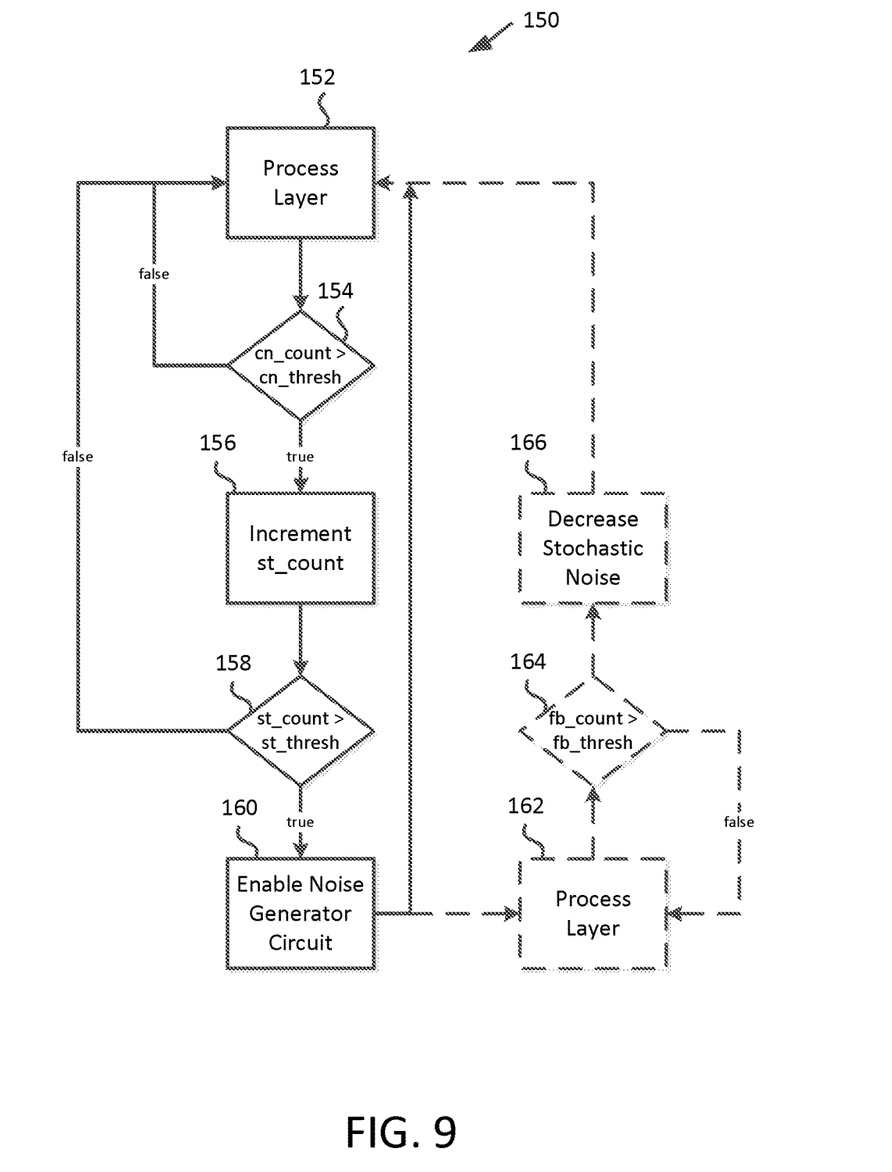
FIG. 9 is a flowchart illustrating a method for controlling stochastic floor mitigation according to an embodiment of the present disclosure.

FIG. 9 is a flowchart illustrating a method 150 for controlling stochastic floor mitigation according to an embodiment of the present disclosure. In a standard convergence case, the number of failing check nodes will fall towards zero and quickly go to zero once the decoder has started to converge. In the event of a trapping condition the number of failing check nodes will reach a relatively low value and then progress no further.

As shown in FIG. 9, an example trap detection method of an embodiment of the present disclosure begins with processing a layer 152. A determination is made, at 154, whether a number of failing check nodes (cn_count) is above a configurable check node threshold (cn_thresh). If the determination in 154 is true, then a length of time (st_count) that the number of passing check nodes is above a configurable check node threshold (cn_thresh) is incremented in 156. The term st_count represents a stagnancy count, or an identification of entering a period of stagnation.

A determination is then made, at 158, whether the length of time above the threshold condition exceeds a configurable count threshold (st_thresh); if yes, then this is confirmation that a trapping set has been detected. While st_count is being incremented, there is a potential trapping set condition; after reaching st_thresh, a trapping set condition is confirmed. In an example implementation, if we count up to the stagnancy threshold (for example, about 6), then determine that we're in a trap, and turn on high stochastic noise in 160 and process the layer as usual.

Once a trapping set, or trap state, is detected in 158, then in 160 the noise generator circuit, or noise source, is enabled, or a noise generator circuit is set to a high noise state. In FIG. 8, a noise source is presumed to be off until step 160. In an example embodiment, 160 comprises permanently setting a noise source to a high stochastic noise state. In another embodiment, the noise setting is changed back to a lower setting or a null setting after a threshold amount of time associated with exiting the trapping set.

In an embodiment including the attenuation factor method, 160 comprises enabling attenuation factor modulation; in the additive noise method, 160 comprises enabling noise addition. In an example embodiment, 160 comprises adding high stochastic noise one layer at a time in a layered decoder.

FIG. 9 also illustrates some optional steps in an embodiment of the method 150. In step 162, a layer is further processed and in 164 a determination is made whether a number of layers (fb_count) has exceeded a configurable threshold (fb_thresh). In an example embodiment, the count of the number of layers (fb_count) starts at zero and goes up to the configurable threshold, such as a value of 4. For every layer that is run with high stochastic noise, the fb_count is incremented. In an example embodiment, when the result of the determination 164 is false, fb_count is incremented.

In some implementations, it is advantageous to remove or decrease the noise after a positive determination in 164. For example, step 166 shows decreasing the stochastic noise applied in step 160. In another embodiment, the stochastic noise can be permanently enabled once a trap state, or trapping set, has been detected.

SFM in Operation

Figure 10:
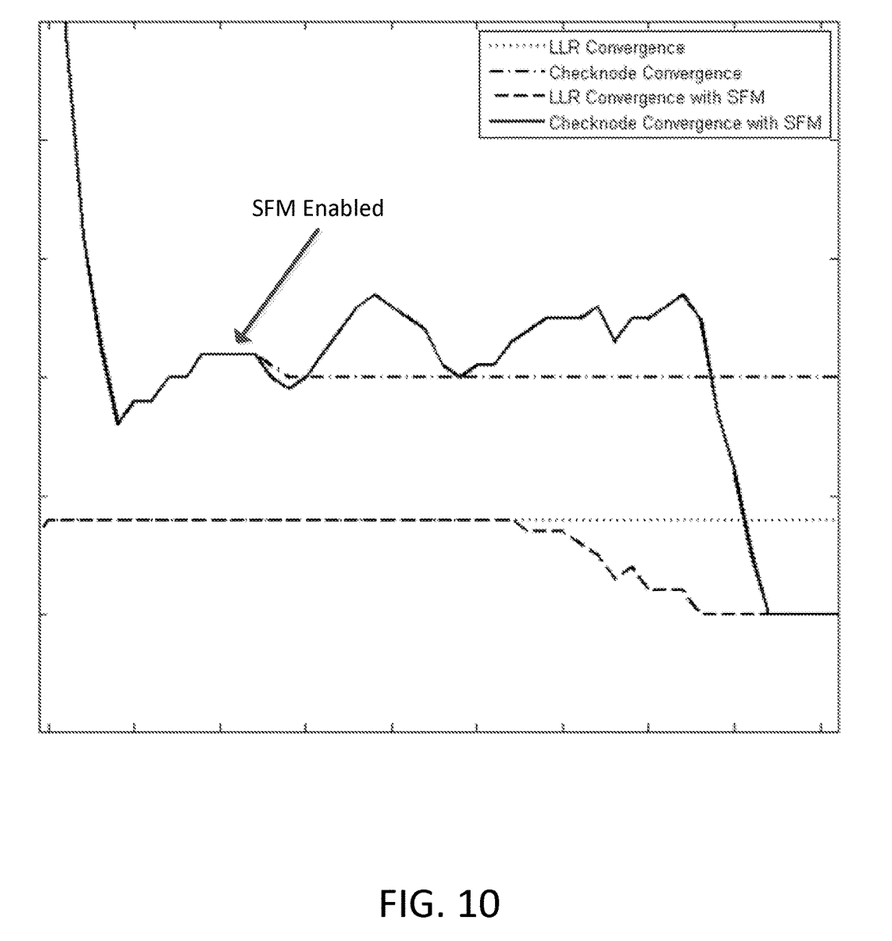
FIG. 10 is a graph illustrating an example of stochastic floor mitigation on a trapping set according to an embodiment of the present disclosure.

A graph showing the result of the operation of SFM on a trapped FEC block is shown in FIG. 10. In this case the FEC block has converged rapidly to the trapping set, as observed by the low bit error count and rapidly converged failing check node count. At this point the standard layered decoder method can make no further progress as observed by the constant bit error rate and failing check node count in the figure. When the SFM method is enabled the effect on the failing check node counts can be almost immediately observed, as shown at the point marked SFM Enabled in FIG. 10. More check nodes begin failing as we perturb the status quo of the trapping set. Initially this has no effect on the number of incorrect bits in the decoder but after disturbing the state of the decoder for several layers the number of incorrect bits begins to decrease. When the number of failing check nodes finally begins to decrease it falls rapidly along the same trajectory as the initial convergence plot. Note that the number of incorrect bits reaches zero a couple of layers before the check nodes in error reaches zero. In this example, additive noise in a range of ±20% check node output dynamic range was used and maintained at this level until convergence was achieved.

In a typical embodiment the various parameters that control SFM are placed under register control to allow for testing and refinement on operational hardware. In an example embodiment, these parameters include one or more of: Cn_thresh; St_thresh; Fb_thresh; Noise source max; Noise source min.

Embodiments of the present disclosure achieve improved error floor performance for any LDPC code. Embodiments of the present disclosure do not require pre-knowledge of the H matrix or any detailed understanding of the trapping mechanism for a given H matrix.

Embodiments of the present disclosure are applicable to any iterative FEC decoder method such as LDPC or Turbo Decoders. Embodiments of the present disclosure can be used over a wide range of Code rates and can be used within fully programmable code decoders.

Embodiments of the present disclosure would generally be more useful in higher rate systems since error floor issues increases as the code rate increases. The application of embodiments of the present disclosure lowers the requirement for generating a perfect error floor H matrix allowing other factors such as power-consumption or encoder complexity to be improved instead.

In many communication systems, error floor performance is a critical factor. SFM according to an embodiment of the present disclosure can lower the error floor in a cost efficient manner, i.e. less encoder/decoder area and power consumption and less engineering time to find the perfect H matrix.

In the present disclosure, a novel method for resolving error floor conditions within iterative FEC decoders is provided. The Stochastic Floor Mitigation method does not impact standard convergence of the decoder and can be used to effectively resolve trapping conditions without prior knowledge or understanding of these trapping sets. The SFM method and operation are presented within the context of a Layered LDPC decoder.

Embodiments of the present disclosure can be deployed in any communication systems that employ iterative FEC methods including but not limited to LDPC codes. Embodiments of the present disclosure are particularly useful in situations where the error floor requirements of a given system are very low or are simply lower than the error floor of a given H matrix. Embodiments of the present disclosure would typically but not always be implemented as an Application Specific Integrated Circuit (ASIC). More specifically, embodiments of the present disclosure may be employed in systems such as, but not limited to: Optic Fiber based Metro and Wide Area Networks (MANs and WANs); and Flash memory Physical Layer.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a hardware product implemented in an Integrated Circuit (IC), Programmable Gate Array, or some combination of Integrated Circuit(s), Programmable Gate Array(s), and Software. Those of ordinary skill in the art will appreciate that other functions can also be implemented on such Integrated Circuits or Programmable Gate Arrays.

The above-described embodiments are intended to be examples only. Alterations, modifications and variations can be effected to the particular embodiments by those of skill in the art without departing from the scope, which is defined solely by the claims appended hereto.

What is claimed is:

1. An Error Correction Code (ECC) decoder, comprising:
   one or more layer processors, each of the one or more layer processors including
   a check node processor;
   a delay element for storing extrinsic information; and
   a stochastic floor mitigation (SFM) circuit configured to correct trapping set conditions, the stochastic floor mitigation circuit comprising a noise generator circuit provided between a check node processor output and an output of the ECC decoder.

2. The ECC decoder of claim 1 wherein the SFM circuit further comprises a trapping set detector to determine when a trapping set has been encountered.

3. The ECC decoder of claim 2 wherein the SFM circuit is enabled based on a determination of the trapping set detector.

4. The ECC decoder of claim 2 wherein the SFM circuit is enabled in response to completion of a threshold number of iterations independent of a determination of the trapping set detector.

5. The ECC decoder of claim 1 wherein the noise generation circuit comprises an additive noise source that adds noise to an output of the check node processor.

6. The ECC decoder of claim 1 wherein the noise generation circuit comprises an attenuation factor modulator for modifying an attenuation factor associated with the check node processor.

7. The ECC decoder of claim 6 wherein the attenuation factor modulator comprises an attenuation factor multiplier for modifying an attenuation factor associated with each check node output of the check node processor.

8. The ECC decoder of claim 1 wherein the SFM circuit comprises a biased noise source configured to generate a noise magnitude between a maximum and minimum value for a number of configurable iterations or layers.

9. The ECC decoder of claim 1 wherein the ECC code is a Low Density Parity Check (LDPC) code.

10. The ECC decoder of claim 2 wherein the trapping set detector comprises a single trapping set detector in communication with each of the one or more layer processors to determine when a trapping set has been encountered.

11. The ECC decoder of claim 2 wherein the trapping set detector is configured to detect a trapping set condition based on a count of all check nodes that are passing within the decoder.

12. The ECC decoder of claim 2 wherein the trapping set detector is configured to receive a parity status from one or more check nodes and to output an enable to the noise generation circuit of each of the one or more layer processors.

13. The ECC decoder of claim 2 wherein the trapping set detector is configured to detect a trapping set condition based on a count, for each of the at least one layer processors, of bit flips observed between an output of the noise generation circuit and an input of the check node processor.

14. The ECC decoder of claim 2 wherein the trapping set detector is configured to detect a trapping set condition based on a magnitude observed at an input of the one or more layer processors.

15. The ECC decoder of claim 1 further comprising a Layered LDPC Decoder configured to perform a LDPC decoding operation.

16. The ECC decoder of claim 15 wherein the layered LDPC Decoder comprises:
   a codeword memory element to store a full FEC block to be processed;
   a plurality of shift processors configured to perform a circulant shift operation specified by an H matrix;
   a plurality of layer processors;
   a noise source affecting the output of the check node processor; and
   a SFM controller configured to enable and control an SFM method performed by the SFM circuit.

17. The ECC decoder of claim 16 wherein a single Layer Processor accepts one input, $V_C$, from every column in the H matrix every clock cycle.

18. The ECC decoder of claim 16 wherein some of the inputs in the Layer Processor are to a maximum zero value for an all-zero entry in the H matrix.

19. The ECC decoder of claim 16 wherein a Layer Processor comprises:
   a subtractor for removing the previous extrinsic information for this layer from $V_C$ to form the Check Node input;
   a Check Node for calculating an approximation of the belief propagation method;
   an adder for combining the Check Node input and Check Node output; and
   a delay element for storing the Check Node output for use in a subsequent iteration.

20. The ECC decoder of claim 16 wherein the noise source is configured to apply additive noise to the check node outputs.

21. The ECC decoder of claim 16 wherein the noise source is implemented as a modulation factor applied to the attenuation factor of the check node.

* * * * *